United States Patent [19]

Chopy

[11] Patent Number: 4,983,821
[45] Date of Patent: Jan. 8, 1991

[54] PHOTOMULTIPLIER TUBE WITH ELECTRODE SUPPORTS

[75] Inventor: Hervé Chopy, Mansac, France

[73] Assignee: U.S. Philips Corp., New York, N.Y.

[21] Appl. No.: 369,566

[22] Filed: Jun. 21, 1989

[30] Foreign Application Priority Data

Jun. 24, 1988 [FR] France .................... 88 08501

[51] Int. Cl.⁵ .................... H01J 40/14; H01J 43/18
[52] U.S. Cl. .................... 250/207; 313/533
[58] Field of Search .............. 250/207, 213 VT, 239;
313/533, 534, 535, 536, 528, 103 CM, 105 CM, 105 R, 532

[56] References Cited

U.S. PATENT DOCUMENTS

| | | | |
|---|---|---|---|
| 2,141,322 | 12/1938 | Thompson | 250/207 |
| 4,180,725 | 12/1979 | Abraham et al. | 250/207 |
| 4,355,258 | 10/1982 | Butterwick | 313/533 |
| 4,570,102 | 2/1986 | McDonie et al. | 313/533 |
| 4,577,137 | 3/1986 | Kaiser | 313/533 |
| 4,668,890 | 5/1987 | Swingler | 313/533 |

FOREIGN PATENT DOCUMENTS 899742  7/1949  Fed. Rep. of Germany .

OTHER PUBLICATIONS

Wilcox et al., "Development of Fast Photomultiplier Tubes", *Electro-Optic Syst. Des.*, vol. 11, No. 3, 3/79, pp. 41–45.

Primary Examiner—David C. Nelms
Assistant Examiner—Michael Messinger
Attorney, Agent, or Firm—William L. Botjer

[57] ABSTRACT

A photomultiplier tube having an electron multiplier comprising a dynode with an attachment lip (10) which is introduced into a slot (20) which is formed in a supporting board (30), the said slot (20) comprising, on the one hand, two outer supporting points (21a, 21b) against which the said attachment lip (10) bears with a first surface (11), and which supporting points have rounded end portions (22a, 22b) and, in addition, at least one central supporting point (23) on which the said attachment lip (10) abuts via a second face (12), which slot (20) comprises holes (24a, 24b, 25) which are located opposite the said outer supporting points (21a, 21b) and the central supporting point (23).

5 Claims, 1 Drawing Sheet

PHOTOMULTIPLIER TUBE WITH ELECTRODE SUPPORTS

BACKGROUND OF THE INVENTION

The invention relates to a photomultiplier tube comprising an electron multiplier assembly having supports provided with a plurality of slots and a plurality of electrodes attached to the supports by means of attachment lips which are each disposed inside a respective slot.

The invention can be very advantageously used, for example, in the field of photomultiplier tubes when electrodes, called dynodes, are to be kept in slots formed in insulating supports which are also used as spacers.

Various supports for holding dynodes, as described in the opening paragraph, are known, for example, a supporting board having narrow slots and a dynode with an attachment lip whose end portion is bent after insertion into the slot. Another interesting support however, comprises wide slots which cooperate with a protrusion formed on the attachment lip whose end portion may alternatively be bent.

The present state-of-the-art photomultiplier tubes having supporting boards, however, all have drawbacks. The manufacture of a supporting board having narrow slots is a difficult and costly operation; moreover, its application is difficult because introducing an attachment lip into a narrow slot is a delicate operation for the person entrusted therewith. On the other hand, it is much simpler to produce a wide slot because of the larger tolerances, however, a special shape will nevertheless have to be imparted to the attachment lip, such as the formation of a protrusion, which increases the cost of the holding device. In addition, in the two examples described above, the bending of the end portion of the attachment lip after its insertion renders the use of the photomultiplier tube more complex and hence more costly.

SUMMARY OF THE INVENTION

It is an object of the invention to provide a photomultiplier tube comprising dynodes which are accommodated in a support by means of attachment lips, and which tube can be manufactured in a simple manner at low cost and which can be readily put into operation, while ensuring the dynode to be positively and properly held in the slot.

This object is achieved according to the invention in that each attachment lip is disposed in a clamping manner inside the respective slot.

An important technical achievement of the photomultiplier tube according to the invention is that it comprises a "wider" slot, which is equivalent to a "narrow" slot and which has all the favourable holding properties. The clamping attachment of the dynodes inside the slots can be readily obtained by providing each slot according to a preferred embodiment of the inventive photomultiplier tube with at least two supporting points at its extremities, called outer supporting points, which are in contact with a first surface of the respective attachment lip, and at least one supporting point in its central portion, called central supporting point, which is in contact with a second surface of the attachment lip, each extremity having a uniformly varying shape. Preferably, the length ($L_1$) of the slot is greater than or equal to the width (1) of the attachment lip.

In order to enable the attachment lip to be introduced between the two outer supporting points and the central supporting point, the slot is provided with a hole on the side of the attachment lip opposite the central supporting point, and, preferably, the insertion end of the attachment lip comprises bevel means, and the hole which is located opposite the central supporting point, called central hole, has a width which is at least equal to that of the insertion end. Thus, positioning the attachment lip in the "equivalent" slot is carried out by first introducting the said lip into the central hole after which, in a second step, a slight pressure is exerted on the lip so as to locate it between the outer supporting points and the central supporting point. The introduction of the attachment lip into the central hole is facilitated by the said bevel means, which in the case of large-scale production leads to a great saving of time and a high-quality fixation.

BRIEF DESCRIPTION OF THE DRAWING

The invention will be explained in more detail by means of non-limitative examples and with reference to the accompanying drawings, in which.

DETAILED DESCRIPTION OF THE PREFERRED EMBODIMENT

Figure 1:
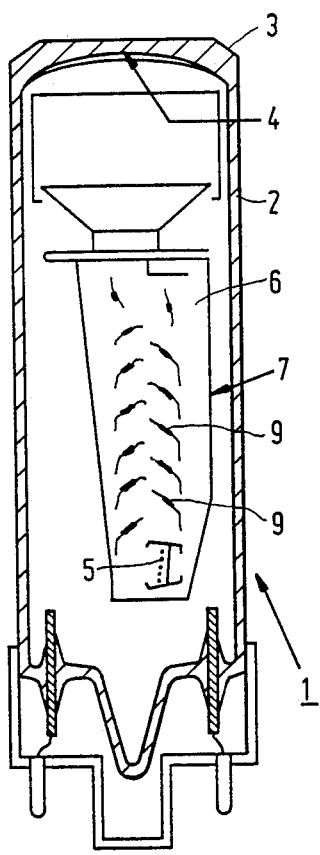
FIG. 1 is a sectional view of a photomultiplier tube comprising a multiplier device according to the invention.

FIG. 1 shows a photomultiplier tube 1 comprising an evacuated envelope 2. The envelope is closed at one end by a transparent face plate 3. A photoemissive cathode 4 is provided on the inner surface of the face plate 3. Inside the envelope 2, an anode is provided opposite the cathode 4. Opposite the cathode 4 an anode is provided inside the envelope 2. A multiplier device 6 is placed between the photo anode 4 and the anode 5. The multiplier device 6 has insulative supports 7 with a plurality of slots (not shown in FIG. 1) and a plurality of electrodes 9, called dynodes, attached to the supports 7. Each of the dynodes 9 comprises an attachment lip which is disposed inside a respective slot. Each of the dynodes 9 has a surface facing the photocathode comprising a material for emitting secondary electrons.

In FIG. 1, the dynodes are curved metal plates, however, the invention is not restricted hereto. For example, the dynodes may also have a flat shape.

Figure 2:
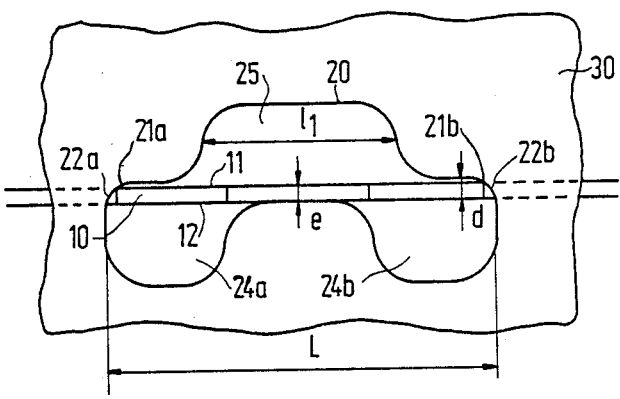
FIG. 2 is a front view of a supporting board having an attachment lip inserted in a slot.

FIG. 2 is a front view of an attachment lip 10 introduced into a slot 20 which is formed in a support, for example a supporting board 30. The supporting board 30 is a spacer which allows the dynodes to be arranged relative to each other in such a manner that the electron multiplier of the tube is formed. As is shown in FIG. 2, the slot 20 comprises two supporting points 21a, 21b called outer support points at its extremities and the lip 10 bears against these supporting points with a first surface 11, in this case the upper surface. The slot 20 also comprises a supporting point 23 in its central portion, which supporting point is called central supporting point, and against which the lip 10 bears with a second surface 12, in this case the lower surface. It is to be noted that without departing from the scope of the invention the slot 20 may comprise more than one central supporting point. FIG. 2 shows that ultimately the outer supporting points 21a, 21b and the central supporting point 23 form an "equivalent" slot whose width, which is defined by the distance d between the outer supporting points and the central supporting point is at most equal to the thickness e of the lip 10, and whose length L is at least equal to the width l of the lip 10 (see FIG. 3). Preferably, the length L is at most equal to the width 1 increased by the rounded portions 22a, 22b. Consequently, the lip 10 is elastically clamped the "equivalent" slot, the clearance necessary for the positioning of the lip being provided by the rounded portions 22a, 22b which form the end portions of the outer supporting points 21a, 21b. On the other hand, FIG. 2 shows that the said slot 20 comprises holes 24a, 24b, 25 which are located opposite the said outer and central supporting points 21a, 21b and 23 respectively. The particular advantage of these holes is that they facilitate the formation of the slot 20 by increasing its dimensions while keeping the "equivalent" slot as narrow as desired. The formation of a wide slot is much simpler and less expensive than the formation of a narrow slot; for example, dynode spacers can be manufactured by means of pressure diecasting an aluminium plate and forming the slot by means of suitable equipment.

Figure 3:
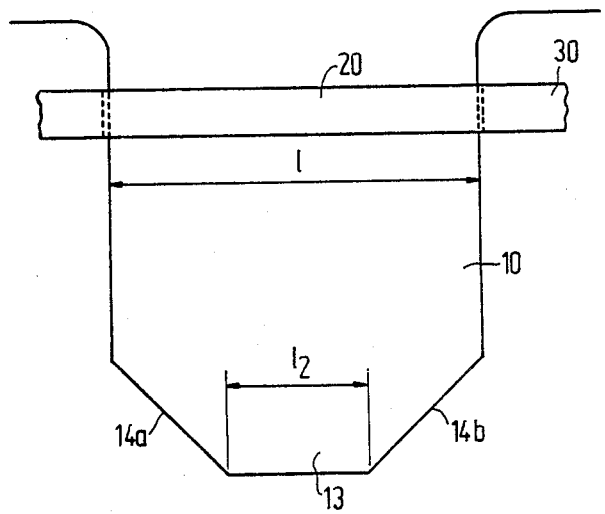
FIG. 3 is a top view which corresponds to the front view of FIG. 2.

The hole 25 which is situated opposite the central supporting point, and which is called central hole, is also useful when the lip 10 is introduced into the slot 20. It is used to guide the insertion end 13 of the lip 10 when the lip is provided with bevel means 14a, 14b (FIG. 2), provided that its width 11 is at least equal to the width 12 of the insertion end 13. The bevel means shown in FIG. 3 are two cants, but they may alternatively have any other equivalent shape, for example, round.

I claim:

1. Photomultiplier tube comprising an electron multiplier assembly having supports provided with a plurality of slots and a plurality of electrodes attached to the supports by means of attachment lip which are each disposed inside a respective slot, wherein the improvement comprises: the attachment lip includes first and second surfaces, the slot includes outer supporting points at its extremities which contact said first surface of said attachment lip and at least one central supporting portion which is in contact with the second surface of said attachment lip, the portion of the slot disposed opposite the central supporting portion being recessed away from said attachment lip and the portions of the slot disposed opposite the outer supporting points being recessed away from said attachment lips to accommodate flexure of said attachment lip, and the outer portion of the slot proximate to the outer edges of the attachment lip are curved to further accommodate flexure of the attachment lip.

2. Photomultiplier tube according to claim 1, characterized in that the length ($L_1$) of the slot is greater than or equal to the width (1) of the attachment lip.

3. Photomultiplier tube according to claim 1, characterized in that the distance (d) between the central supporting point and the outer supporting point is greater than or equal to the thickness (e) of the attachment lip.

4. Photomultiplier tube according to claim 1, characterized in that the slot is provided with a hole on the side of the attachment lip opposite the central supporting point.

5. Photomultiplier tube according to claim 4, characterized in that insertion end (13) of the said lip (10) comprises bevel means (14a, 14b), and in that the hole (25) which is disposed opposite the said central supporting point (23), and which is called central hole, has a width (11) which is at least equal to the width (12) of the said insertion end 13.

* * * * *